(12) United States Patent
Byers (10) Patent No.: US 7,446,855 B2
(45) Date of Patent: Nov. 4, 2008

(54) METHODS AND APPARATUSES FOR CONFIGURING RADIATION IN MICROLITHOGRAPHIC PROCESSING OF WORKPIECES USING AN ADJUSTMENT STRUCTURE

(75) Inventor: Erik Byers, Boise, ID (US)

(73) Assignee: Micron Technology, Inc, Boise, ID (US)

( * ) Notice: Subject to any disclaimer, the term of this patent is extended or adjusted under 35 U.S.C. 154(b) by 0 days.

(21) Appl. No.: 11/189,383

(22) Filed: Jul. 25, 2005

(65) Prior Publication Data

US 2007/0019178 A1 Jan. 25, 2007

(51) Int. Cl.
*G03B 27/54* (2006.01)
(52) U.S. Cl. ........................................ 355/67
(58) Field of Classification Search ............... 355/69, 355/53, 55, 67; 356/401
See application file for complete search history.

(56) References Cited

U.S. PATENT DOCUMENTS

| | | | |
|---|---|---|---|
| 4,988,188 A | 1/1991 | Ohta | |
| 5,142,132 A | 8/1992 | MacDonald et al. | |
| 5,194,893 A | 3/1993 | Nishi | |
| 5,300,971 A | 4/1994 | Kudo | |
| 5,436,464 A | 7/1995 | Hayano et al. | |
| 5,602,620 A | 2/1997 | Miyazaki et al. | |
| 5,610,684 A * | 3/1997 | Shiraishi | 355/55 |
| 5,631,721 A | 5/1997 | Stanton et al. | |
| 5,661,546 A | 8/1997 | Taniguchi | |
| 5,684,566 A | 11/1997 | Stanton | |
| 5,721,608 A | 2/1998 | Taniguchi | |
| 5,796,467 A | 8/1998 | Suzuki | |
| 5,883,700 A | 3/1999 | Someya | |
| 5,907,392 A | 5/1999 | Makinouchi | |
| 5,969,800 A | 10/1999 | Makinouchi | |
| 6,084,244 A | 7/2000 | Saiki et al. | |
| 6,188,464 B1 | 2/2001 | Makinouchi | |
| 6,215,578 B1 | 4/2001 | Lin | |

(Continued)

FOREIGN PATENT DOCUMENTS

JP       11-231234        8/1999

(Continued)

OTHER PUBLICATIONS

Boulder Nonlinear Systems, "256×256 Multi-level/Analog Liquid Crystal Spatial Light Modulator," 2 pages, <http://www.bnonlinear.com/papers/256SLM.pdf>.

(Continued)

*Primary Examiner*—Diane I. Lee
*Assistant Examiner*—Chia-how Michael Liu
(74) *Attorney, Agent, or Firm*—Perkins Coie LLP (57) ABSTRACT

Methods and apparatuses for configuring radiation used in microlithographic processing of workpieces are disclosed herein. One particular embodiment of such a method comprises directing a radiation beam along a radiation path from a reticle to an adjustment structure. The radiation beam has a wavefront with a first configuration in an image plane generally transverse to the radiation path. The method continues by changing at least one independently controllable parameter of the adjustment structure to change the wavefront of the radiation beam from the first configuration to a second configuration. After changing the shape of the wavefront from the first configuration to the second configuration, the method continues by impinging the radiation beam on the workpiece.

53 Claims, 6 Drawing Sheets

U.S. PATENT DOCUMENTS

| | | | |
|---|---|---|---|
| 6,251,550 B1 | 6/2001 | Ishikawa | |
| 6,259,513 B1 | 7/2001 | Gallatin et al. | |
| 6,285,440 B1 | 9/2001 | Takahashi | |
| 6,285,488 B1 | 9/2001 | Sandstrom | |
| 6,291,110 B1 | 9/2001 | Cooper et al. | |
| 6,379,867 B1 | 4/2002 | Mei et al. | |
| 6,392,740 B1 | 5/2002 | Shiraishi et al. | |
| 6,498,685 B1 | 12/2002 | Johnson | |
| 6,501,532 B2 | 12/2002 | Suzuki | |
| 6,504,644 B1 | 1/2003 | Sandstrom | |
| 6,532,056 B2 | 3/2003 | Osakabe et al. | |
| 6,549,266 B1 | 4/2003 | Taniguchi | |
| 6,577,379 B1 | 6/2003 | Boettiger et al. | |
| 6,586,160 B2 | 7/2003 | Ho et al. | |
| 6,674,512 B2 | 1/2004 | Novak et al. | |
| 6,707,534 B2 | 3/2004 | Bjorklund et al. | |
| 6,710,854 B2 | 3/2004 | Shiraishi et al. | |
| 6,784,975 B2 | 8/2004 | Boettiger et al. | |
| 6,794,100 B2 | 9/2004 | Boettiger et al. | |
| 6,816,302 B2 | 11/2004 | Sandstrom et al. | |
| 6,844,972 B2 | 1/2005 | McGuire, Jr. | |
| 6,894,765 B2 | 5/2005 | Mackey et al. | |
| 6,897,943 B2 | 5/2005 | Schroeder et al. | |
| 6,900,827 B2 | 5/2005 | Taniguchi | |
| 7,038,762 B2 | 5/2006 | Boettiger et al. | |
| 7,046,340 B2 | 5/2006 | Boettiger et al. | |
| 7,053,987 B2 | 5/2006 | Mackey et al. | |
| 7,130,022 B2 | 10/2006 | Mackey et al. | |
| 2004/0013956 A1* | 1/2004 | Sogard | 430/30 |
| 2004/0057030 A1 | 3/2004 | Okubo et al. | |
| 2006/0092393 A1* | 5/2006 | Harmed et al. | 355/53 |
| 2006/0158631 A1 | 7/2006 | Boettiger et al. | |
| 2006/0181692 A1 | 8/2006 | Boettiger et al. | |

FOREIGN PATENT DOCUMENTS

| | | |
|---|---|---|
| WO | WO-00/79345 A | 12/2000 |

OTHER PUBLICATIONS

Boulder Nonlinear Systems, "512×512 Multi-level/Analog Liquid Crystal Spatial Light Modulator," 2 pages, <http://www.bnonlinear.com/papers/512SLM.pdf>.

Boulder Nonlinear Systems, "Liquid Crystal Rotators—Ferroelectric and Nematic," 2 pages, <http://www.bnonlinear.com/papers/rotors.pdf>.

Boulder Nonlinear Systems, "Liquid Crystal Shutters / Variable Optical Attenuaters—Ferroelectric and Nematic," 2 pages, <http://www.bnonlinear.com/papers/shutters.pdf>.

Brunner, T.A., "Impact of lens aberrations on optical lithography," Optical Lithography, vol. 41, Nos. 1/2, 1997, <http://www.research.ibm.com/journal/rd/411/brunner.html>.

CRL Opto Limited, LCS2-G Datasheet, 4 pages, 2002, <http://www.crlopto.com/products/datasheets/files/LCS2-datasheet.pdf>.

Digital Optics Corporation, "Pattern Generators," 1 page, 2002, retrieved from the Internet on Jul. 30, 2003, <http://www.digitaloptics.com/products_ind.asp?pid=55>.

Farsari, M. et al., "Microfabrication by use of a spatial light modulator in the ultraviolet: experimental results," Optics Letters, vol. 24, No. 8, pp. 549-550, Apr. 15, 1999, Optical Society Of America, Washington, DC.

Fukuda, H. et al., "Improvement of defocus tolerance in a half-micron optical lithography by the focus latitude enhancement exposure method: Simulation and experiment," J. Vac. Sci. Technol B., vol. 7 No. 4, Jul./Aug. 1989, pp. 667-674.

Hamamatsu Photonics K.K., "PPM—Programmable Phase Modulator," 4 pages, Sep. 2000, <http://www.hamamatsu.com>.

Micro-Optics, Inc., "Polarzation Maintaining Faraday Rotator (PMFR)," 1 page, retrieved from the Internet on Jul. 30, 2003, <http://www.microopticsinc.com/PMFR.html>.

Optics.org, "Micronic and Fraunhofer Develop New Pattern Generators," 1 page, Dec. 10, 1999, <http://www.optics.org>.

Texas Instruments Incorporated, "What the Industry Experts Say About Texas Instruments Digital MicroMirror Display (DMD) Technology," 2 pages, Jun. 1994.

* cited by examiner

METHODS AND APPARATUSES FOR CONFIGURING RADIATION IN MICROLITHOGRAPHIC PROCESSING OF WORKPIECES USING AN ADJUSTMENT STRUCTURE

TECHNICAL FIELD

The present invention is related to methods and apparatuses for configuring radiation used in microlithographic processing of workpieces.

BACKGROUND

Microelectronic features are typically formed in and/or on wafers or other types of workpieces by selectively removing material from the wafer and filling the resulting features with dielectric, semiconductive, and/or conductive materials. Photolithographic processes are generally used to transfer intricate patterns onto very small areas of the wafers. A typical photolithographic process includes depositing a layer of radiation-sensitive photoresist material on the wafer, positioning a reticle having a patterned mask over the photoresist, and then passing an imaging radiation through a patterned area of the reticle to expose the photoresist in the configuration of the patterned mask. A developer, such as an aqueous base or a solvent, is used to remove either the irradiated areas or the masked areas of the photoresist. For example, the exposed portions of the photoresist can change from being generally soluble to become generally insoluble in the developer such that the developer removes the masked portions of the resist layer. Alternatively, the radiation can change a different type of photoresist from being generally insoluble in the developer to be generally soluble such that the exposed portions of the photoresist are removed when the wafer contacts the developer.

Existing lithography processes are capable of creating very complex patterns of extremely small features across the surface of a wafer to form the trenches, vias, holes, implant regions, and other features on a wafer. In a typical application, a lithographic tool transfers the pattern in the reticle to the wafer by scanning or stepping the pattern across precise areas of the wafer. As microelectronic devices become more complex, there is a drive to continually decrease the size of the individual features and increase the density of the features across the wafer. This significantly increases the complexity of lithographic processing because it is increasingly difficult to accurately focus the pattern onto the surface of the wafer. In many applications, the depth of field for focusing the pattern on the wafer is so small that slight variations in the wafer surface can adversely affect the quality of the pattern transferred to the wafer.

Figure 1A:
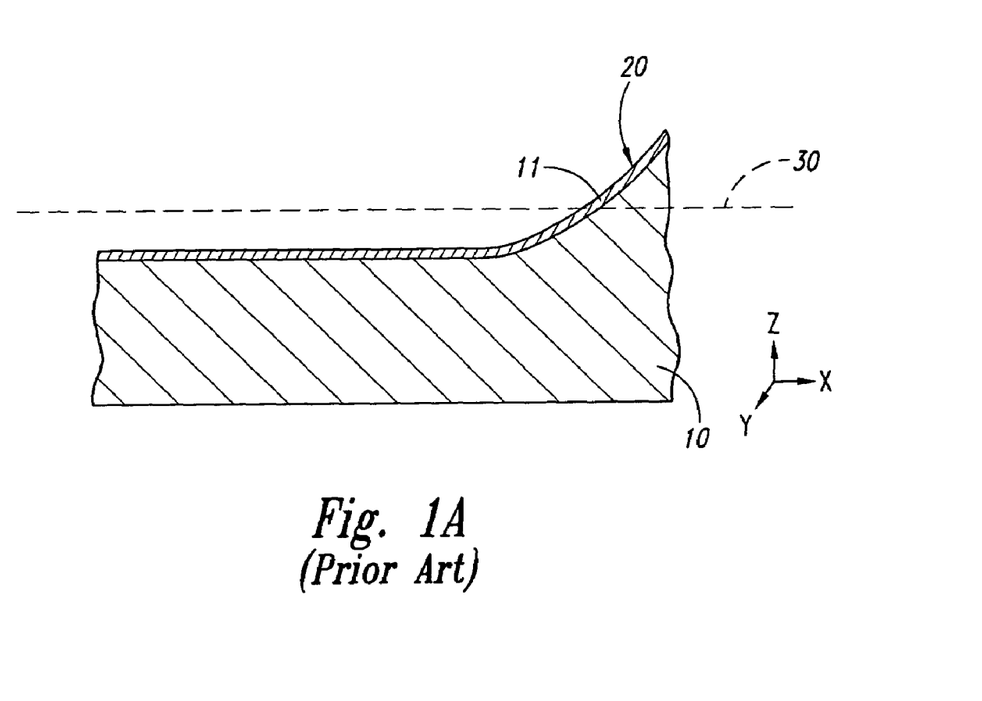
FIGS. 1A and 1B are partially schematic cross-sectional views of a portion of a wafer and an image plane of a radiation beam incident on the wafer in accordance with the prior art.

FIG. 1A is a side cross-sectional view of a wafer 10 having a photoresist layer 11 exposed to a selected radiation. Various fabrication processes performed on the wafer 10 (e.g., etching processes, chemical-mechanical planarization, plating processes, and/or film depositions) can form relatively large surface variations on the wafer 10 (e.g., up to about 6000 Angstroms), particularly in the area 2-5 mm from the edge of the wafer 10. The edge of the wafer 10, for example, includes a topographical feature 20. As mentioned above, the depth of field for focusing the pattern on the wafer 10 is so small that slight variations in the surface topography (e.g., a topographical feature 20) can adversely affect the depth of focus of the radiation incident upon the wafer 10 in such areas. The edges of the photoresist layer 11 remaining on the wafer 10 (after the wafer is exposed to the developer) often become indistinct because of such topographical irregularities. This in turn can adversely affect the definition of the microelectronic features formed on and/or in the wafer 10.

One conventional approach addressing the depth of focus problem described above is to use a straight line "best fit" model to compensate for various topographical features and/or irregularities on the wafer 10. This approach includes adjusting the focus height (i.e., the z-height) of the radiation beam impinging on the wafer 10. In FIG. 1A, for example, an image plane 30 of the beam is adjusted upwardly in an attempt to compensate for the topographical feature 20. More particularly, the image plane 30 is moved upwardly so that it is approximately equidistant from the top. planar surface of the wafer 10 and the top of the topographical feature 20. The z-height variation shown in FIG. 1A, however, is a global variation that is applied across the entire exposure field or exposure slit, in the case of a scanner. Further, the "best fit" shown in FIG. 1A only compensates for the topographical feature 20 at the edge of the wafer 10 and may not compensate for many other topographical features and/or irregularities on the wafer 10. Thus, the compensation for the topographical feature 20 at the edge of the wafer 10 generally negatively affects the rest of the exposure field or slit on the wafer 10.

Figure 1B:
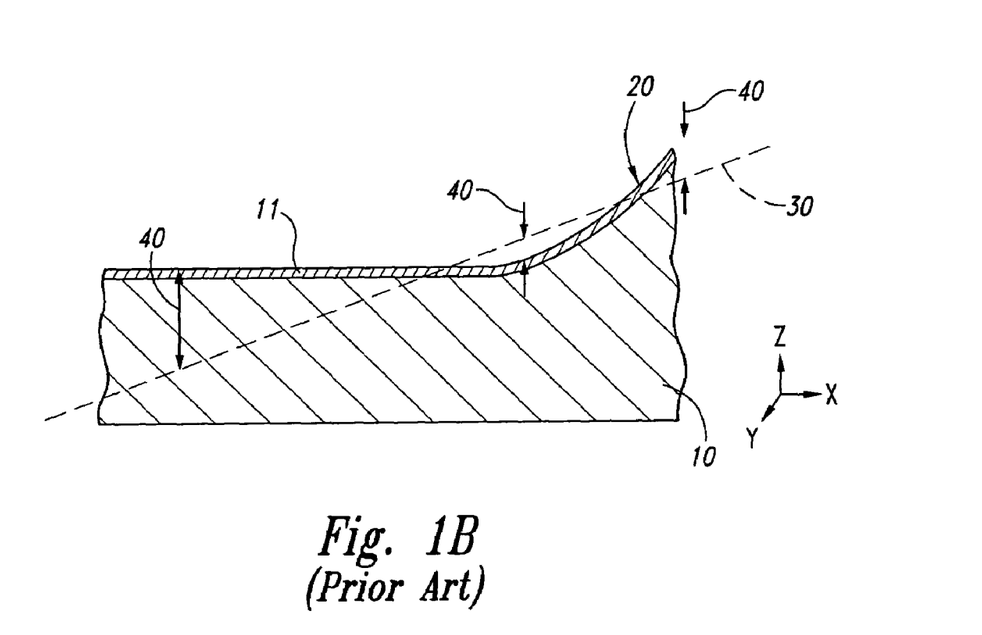

Another approach to addressing the foregoing problem is to tilt the wafer relative to the image plane 30 of the beam. Referring to FIG. 1B, for example, the wafer 10 is tilted relative to the image plane 30 to "best fit" the image plane to the wafer. This approach, however, can also negatively affect the rest of the exposure field or slit. The linear image plane 30, for example, still does not conform to the surface of the wafer 10 or the topographical feature 20, resulting in a number of local z-height variations 40. In many cases, the local z-height variations 40 can be significant. Accordingly, there is a need to improve the process for irradiating microfeature workpieces.

DETAILED DESCRIPTION

A. Overview/Summary

The present disclosure is directed to methods and apparatuses for controlling characteristics of radiation directed to a workpiece in microlithographic processing. One particular embodiment of such a method comprises directing a radiation beam along a radiation path from a reticle to an adjustment structure. The radiation beam has a wavefront with a first configuration in an image plane generally transverse to the radiation path. The method continues by changing at least one independently controllable parameter of the adjustment structure to change the wavefront of the radiation beam from the first configuration to a second configuration. After changing the shape of the wavefront from the first configuration to the second configuration, the method continues by impinging the radiation beam on the workpiece.

The adjustment structure can have several different configurations. In one embodiment, for example, the adjustment structure includes a lens having one or more optical elements that can be independently adjusted to shape the wavefront of the radiation beam. In another embodiment, the adjustment structure can include a reflective medium having one or more reflective portions that can be manipulated to change the shape of the wavefront of the radiation beam from a first shape to a second shape. In still another embodiment, the adjustment structure can include a selectively refractive and transmissive medium having a plurality of individually controllable elements with selective optical properties configured to shape the wavefront of the radiation beam. For example, the elements can be configured to selectively change the refractive index and/or extinction coefficients of the adjustment structure as the radiation beam is passing through.

Another embodiment of a method for controlling characteristics of radiation in photolithographic processing of a microfeature workpiece comprises directing a radiation beam from a radiation source along a radiation path to a reticle. The method continues by directing the radiation beam along the radiation path from the reticle to an adjustment structure. The radiation beam has a wavefront with a first shape in an image plane generally transverse to the radiation path. The method includes impinging the radiation beam on an adjustment structure positioned in the radiation path. The method also includes determining a profile of at least a portion of the workpiece. Based on the profile, the method continues by changing a state of at least one of a plurality of independently controllable elements of the adjustment structure from one state to another state to change the wavefront of the radiation beam from the first shape to a second shape different than the first shape. The second shape corresponds at least in part to the profile of the workpiece. The method continues by directing the radiation beam away from the adjustment structure along the radiation path and impinging the radiation beam on the workpiece.

Additional embodiments of the invention are directed toward apparatuses for controlling characteristics of radiation directed to a workpiece. One embodiment of such an apparatus includes a workpiece support positioned to carry a workpiece and a radiation source positioned to direct a radiation beam along a radiation path toward the workpiece support. The radiation beam has a wavefront with a first configuration relative to an image plane generally transverse to the radiation path. The apparatus further includes a reticle positioned along the radiation path between the source of radiation and the workpiece support and an adjustment structure positioned in the radiation path between the reticle and the workpiece support. The adjustment structure is configured to alter the radiation beam to produce a wavefront having a second configuration in the image plane. The adjustment structure can include one or more independently controllable elements that are changeable from a first state to a second state to change the wavefront of the radiation beam from the first configuration to the second configuration. In several embodiments, the apparatus can further include a controller operatively coupled to the adjustment structure to control the elements of the adjustment structure to change from the one state to another state.

The term "microfeature workpiece" is used throughout to include substrates upon which and/or in which microelectronic circuits or components, data storage elements or layers, vias or conductive lines, micro-optic features, micromechanical features, and/or microbiological features are or can be fabricated using microlithographic techniques. Many specific details of certain embodiments of the invention are set forth in the following description and in FIGS. 2-5D to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the invention. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of features are not precluded.

Figure 2:
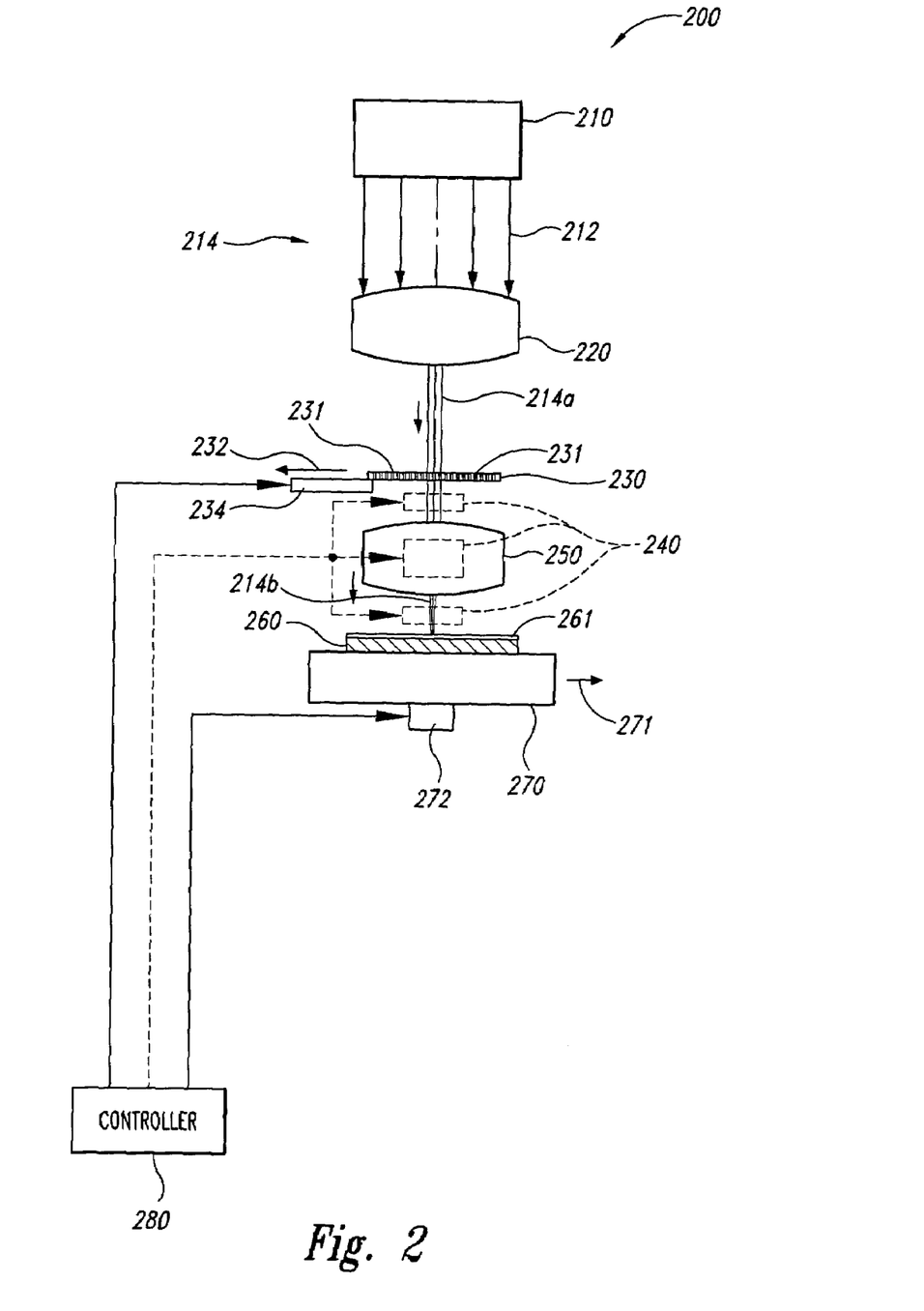
FIG. 2 is a partially schematic view of an apparatus for irradiating microfeature workpieces in accordance with an embodiment of the invention.

B. Methods and Apparatuses for Configuring Radiation Directed Toward a Microfeature Workpiece FIG. 2 schematically illustrates an apparatus 200 for configuring radiation directed to a microfeature workpiece 260 in accordance with an embodiment of the invention. The apparatus 200 can include an electromagnetic radiation source 210 that directs a radiation beam 212 along a radiation path (or optical axis) 214 toward the workpiece 260. The radiation beam 212 can optionally pass through a lens system 220 configured to shape and/or magnify the radiation emitted by the source 210. Optionally, the lens system 220 can further include additional optics to size and/or condition the beam 212 before directing the beam 212 along a reticle radiation path segment 214a to a reticle or mask 230.

In one embodiment, the reticle 230 can include reticle apertures 231 through which the radiation beam 212 passes to form an image on the workpiece 260. Prior to impinging on the workpiece 260, the radiation beam 212 passes through an adjustment structure 240 (shown schematically) that adjusts a wavefront of the beam 212 and projection optics 250 that reduce the size of the image pattern defined by the reticle 230 to correspond to the size of the features to be formed on the workpiece 260. As described in greater detail below, the wavefront of the beam 212 can be adjusted by the adjustment structure 240 so that the shape of the wavefront generally corresponds at least in part to various topographical features on the surface of the workpiece 260. The adjustment structure 240 can be positioned at various locations between the reticle 230 and the workpiece 260. For example, the adjustment structure 240 can be positioned (a) between the reticle 230 and the projection optics 250, (b) within the projection optics 250, or (c) between the projection optics 250 and the workpiece 260. The radiation beam 212 can pass from the projection optics 250 and the adjustment structure 240 along a workpiece radiation path segment 214b to impinge on a radiation-sensitive material (such as a photoresist layer 261) of the workpiece 260 and form an image on the layer 261.

The workpiece 260 is supported on a workpiece support 270. In one embodiment of a scanner arrangement, the workpiece support 270 moves along a workpiece support path 271, and the reticle 230 moves along a reticle path 232 in the opposite direction to scan the image produced by the reticle 230 across the layer 261. Accordingly, the workpiece support 270 can be coupled to a support actuator 272, and the reticle 230 can be coupled to a reticle actuator 234. As the reticle 230 moves opposite the workpiece support 270 and the workpiece 260, the radiation source 210 can provide a continuous beam or discrete flashes to irradiate successive portions of the workpiece 260 with the images produced by the reticle 230 until an entire field of the workpiece 260 is scanned. In the case of flashing the workpiece 260, the radiation source 210 can flash at the same rate throughout the scanning process (assuming the reticle 230 and the workpiece support 270 each move at a constant rate) to uniformly irradiate each field of the workpiece 260. In any of these embodiments, each field can include one or more die or chips, or alternatively, each field can include other features.

In another embodiment (a stepper arrangement), the radiation beam 212 and the reticle 230 can expose an entire field of the workpiece 260 in one or more flashes while the reticle 230 and the workpiece support 270 remain stationary transversely relative to the radiation path 214. After the field has been exposed, the reticle 230 and/or the workpiece support 270 can move transverse to the radiation path 214 to expose another field. This process can be repeated until each field of the workpiece 260 is exposed. Suitable scanner and stepper devices are available from ASML of Veldhoven, The Netherlands; Canon USA, Inc., of Lake Success, N.Y.; and Nikon, Inc. of Tokyo, Japan.

In a further aspect of the foregoing embodiments, a controller 280 is operatively coupled to the reticle 230 (or the reticle actuator 234) and the workpiece support 270 (or the support actuator 272). Accordingly, the controller 280 can include a processor, microprocessor, or other device that can automatically (with or without user input) control and coordinate the relative movement between these elements. The controller 280 can also be operatively coupled to the adjustment structure 240 and coordinate operation of the adjustment structure 240 based on profile information from the workpiece 260. The profile information can be determined using an interferometer, a scatterometer, a predetermined topographical map of the workpiece 260, or other methods known to those of skill in the art.

Figure 3:
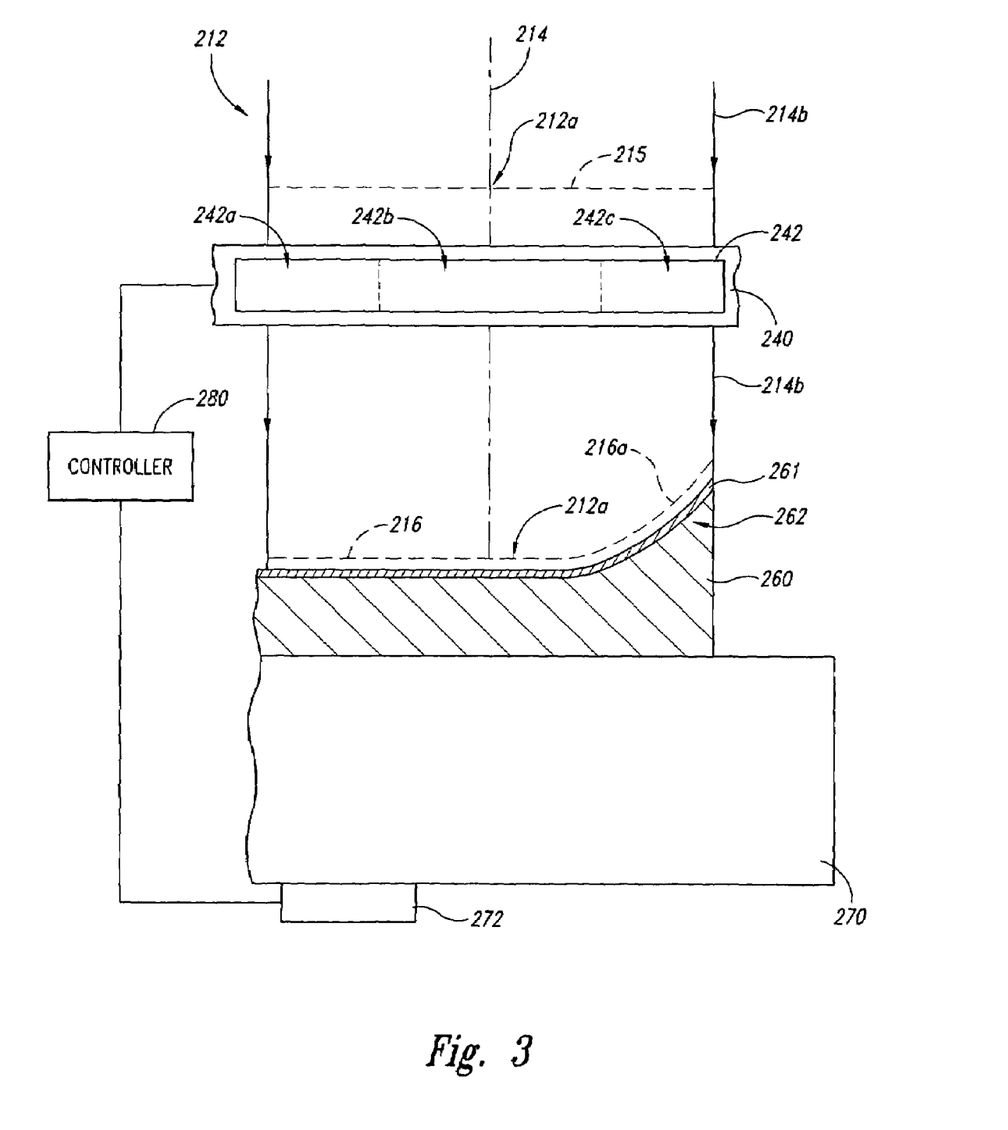
FIG. 3 is a partially schematic view of an adjustment structure for shaping and/or orienting a radiation beam impinging on a microfeature workpiece in accordance with an embodiment of the invention.

FIG. 3 is an enlarged view of a portion of the apparatus 200 illustrating the adjustment structure 240 configuring one or more portions of the beam 212 impinging on the workpiece 260. The adjustment structure 240 in the illustrated embodiment includes at least one independently controllable element 242 (three are shown schematically in FIG. 3 as a first element 242a, a second element 242b, and a third element 242c). The control elements 242a-c can be adjusted independently (e.g., using the controller 280) as various portions of the workpiece 260 are irradiated.

The adjustment structure 240 is positioned to "configure" a wavefront 212a of the beam 212 (which has an initial generally linear profile across the beam) to generally correspond to at least a portion of the profile of the workpiece 260. To change the configuration of the wavefront, the adjustment structure 240 is configured to change the optical path length and/or velocity of the radiation passing through various portions of the adjustment structure 240. The path length and/or velocity can generally be manipulated by (a) changing the shape of the adjustment structure 240 through which the radiation passes (i.e., radiation passing through different portions of the adjustment structure will travel different distances), and/or (b) changing the optical properties of one or more portions of the adjustment structure 240 (i.e., radiation traveling through different portions of the adjustment structure 240 will travel at different velocities). In the illustrated embodiment, for example, at least one element 242 of the adjustment structure 240 changes from a first state to a second state in a manner that changes the wavefront 212a from a first configuration 215 in an image plane generally transverse to the radiation path 214 to a second configuration 216 in the image plane having a curved portion 216a corresponding at least in part to a topographical feature 262 at an edge of the microfeature workpiece 260. In embodiments that include more than a single control element 242, each control element 242 can be independently controlled to alter the path length and/or velocity of discrete portions of the radiation passing through corresponding control elements 242. Various embodiments of the adjustment structure are described in further detail below with respect to FIGS. 5A-5D.

In several embodiments, the configuration of the wavefront 212a can be changed dynamically as various portions of the workpiece 260 are irradiated using either the scanner or stepper arrangement described above. If the apparatus 200 is configured in a scanner arrangement, for example, the adjustment structure 240 can selectively tailor the wavefront 212a of the beam 212 to each portion of the workpiece 260 as successive portions of the workpiece are irradiated. The adjustment structure 240 can similarly tailor the wavefront 212a of the beam 212 throughout the irradiation process if the apparatus 200 is configured in a stepper arrangement. In other embodiments, the adjustment structure 240 can be static with respect to the workpiece 260 during an imaging cycle. For example, the adjustment structure 240 can be configured between imaging cycles to compensate for the large topographical feature 262 at the edge of the workpiece 260 without compensating for other topographical features on the workpiece.

One advantage of embodiments of the apparatus 200 described above with reference to FIGS. 2 and 3 is that the adjustment structure 240 can precisely control of the wavefront 212a of the beam 212 impinging on the microfeature workpiece 260 because the wavefront 212a is configured according to at least a portion of the profile of the workpiece 260. This degree of precision can significantly improve the quality of the microlithographic process (e.g., improve the depth of focus). For example, by locally changing the wavefront 212a of the beam 212 to better fit the surface topography of the workpiece 260, the definition of the pattern projected onto the photoresist layer 261 can be improved compared with patterns available via conventional methods described above with respect to FIGS. 1A and 1B.

Another feature of the apparatus 200 described above is that the configuration of the adjustment structure 240 can be easily controlled (e.g., by providing instructions from the controller 280). An advantage of this feature is that unlike conventional lenses, filters, and/or pellicles, the adjustment structure 240 can configure the wavefront 212a without removing the adjustment structure and replacing it with a different one to produce a new wavefront shape for a different workpiece. Accordingly, this arrangement can be less expensive than conventional arrangements because it requires fewer pieces of hardware (e.g., lenses and filters) to be customized for different types of workpieces. This arrangement can also be significantly more efficient because it can take much less time to change the configuration of the wavefront of the radiation beam to better correspond to the contours of the workpiece 260. In fact, as described above, the changes can occur dynamically during the irradiation process.

Yet another advantage of embodiments of the apparatus 200 described above is that the adjustment structure 240 can improve the depth of focus of the beam 212 impinging on the photoresist layer 261 over more of the workpiece and, in turn, reduce the sensitivity of the photoresist layer 261 to variations in exposure time during subsequent processing steps. This is particularly important when the thickness of the photoresist layer 261 on the workpiece 260 varies. For example, the thick and thin regions of the photoresist layer 261 can receive similar exposure times without overexposing thin regions and/or underexposing thick regions.

Figure 4:
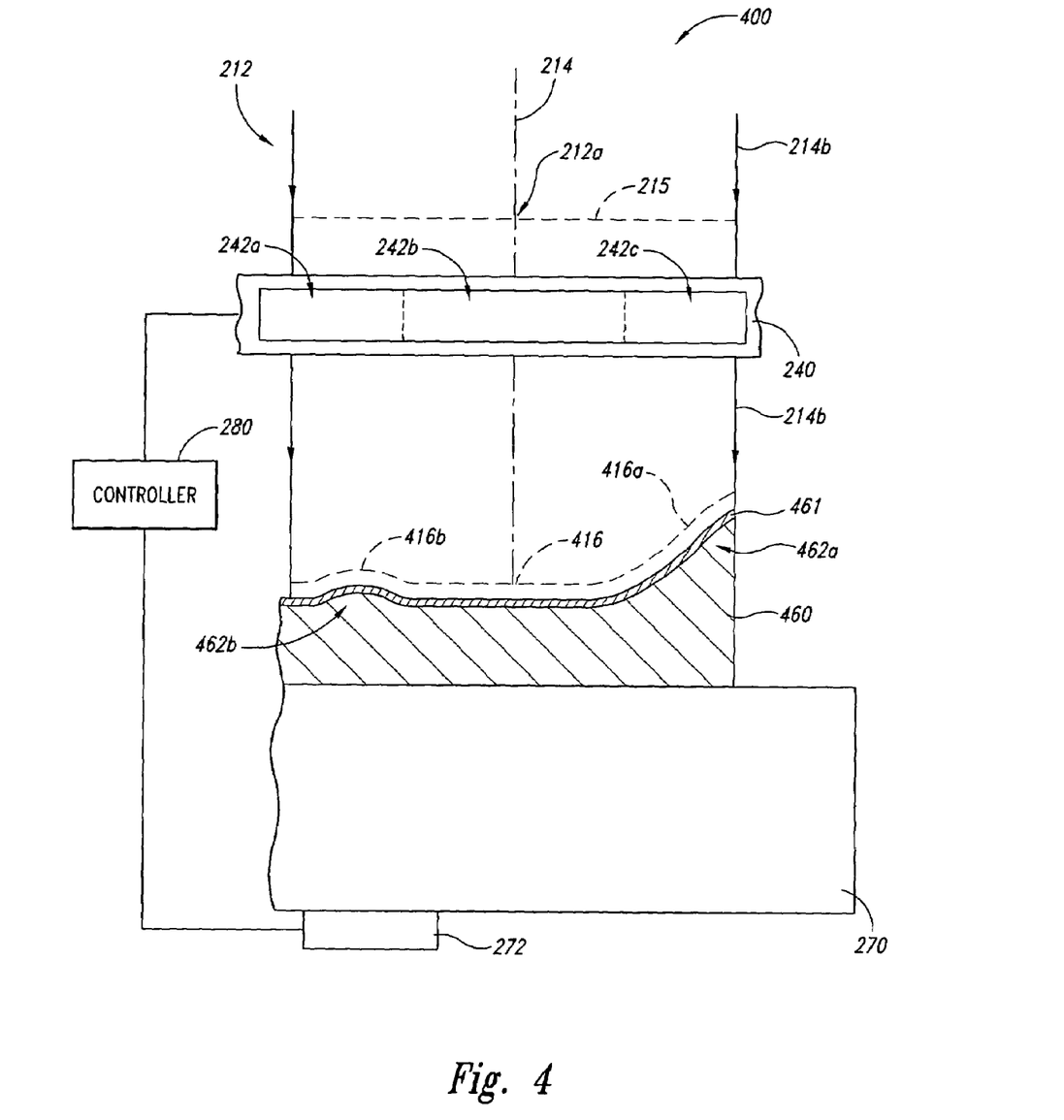
FIG. 4 is a partially schematic view of an adjustment structure for shaping and/or orienting a radiation beam impinging on a microfeature workpiece in accordance with another embodiment of the invention.

FIG. 4 is an enlarged view of a portion of an apparatus 400 illustrating the adjustment structure 240 configuring the beam 212 impinging on a radiation-sensitive material (such as a photoresist layer 461) of a microfeature workpiece 460 and forming an image on the layer 461 in accordance with another embodiment of the invention. The embodiment illustrated in FIG. 4 differs from the embodiments described above in that the shape of the wavefront 212a is changed in two different portions (rather than just the single portion shown in FIG. 3) to compensate for two different topographical features 462a and 462b on the workpiece 460. More specifically, one or more elements 242a-c of the adjustment structure 240 change from one state to another state to change the shape of the wavefront 212a from the first shape 215 (e.g., generally linear) to a second shape 416 having a first curved portion 416a (corresponding to the first topographical feature 462a) and a second curved portion 416b (corresponding to the second topographical feature 462b).

One feature of the apparatus 400 is that discrete portions of the wavefront 212a can be controlled according to several different features on the workpiece 460. An operator, for example, can compensate for various topographical features (e.g., first topographical feature 462a and second topographical feature 462b) without imposing undesirable changes on the rest of the exposure field of the radiation incident on the workpiece 460. Accordingly, this arrangement can be particularly advantageous for applications where a conventional arrangement might alter the wavefront to compensate for one feature on the workpiece, while negatively affecting the rest of the exposure field.

C. Additional Embodiments of Adjustment Structures for Configuring Radiation Wavefronts FIGS. 5A-5D illustrate several different adjustment structures in accordance with embodiments of the invention. The adjustment structures shown in FIGS. 5A-5D can all be used with the apparatuses 200 and 400 described above with reference to FIGS. 2-4, and various features of the adjustment structures shown in FIGS. 5A-5D can be combined with each other in still additional embodiments.

Figure 5A:
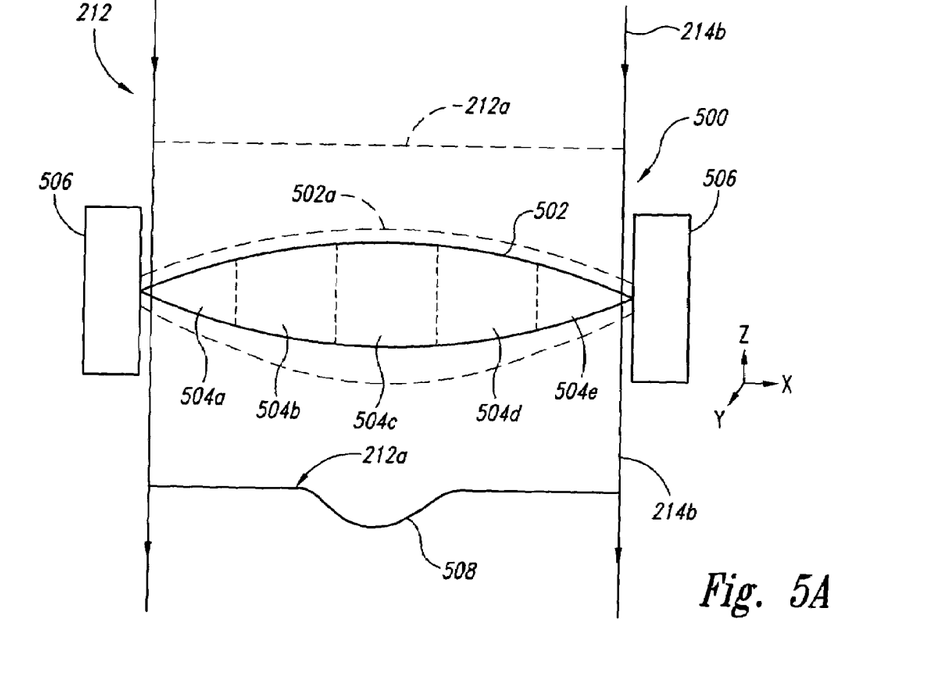
FIG. 5A is a partially schematic view of an adjustment structure that includes a lens having a plurality of elements in accordance with an embodiment of the invention.

FIG. 5A, for example, is a side cross-sectional view of an adjustment structure 500 in accordance with an embodiment of the invention. The adjustment structure 500 includes a flexible, deformable lens 502 having at least one optical element 504 (five optical elements are identified in FIG. 5 by reference numbers 504a-e). Each optical element 504 can be independently adjusted or otherwise controlled to shape the wavefront 212a of the beam 212. The lens 502 is operatively coupled to at least one actuator 506 configured to move one or more of the elements 504a-e relative to each other by compressing, expanding, and/or twisting various portions of the lens 502 in the x-, y-, and/or z-direction. As a result of changing the lens 502 from its original shape 502a (shown in broken lines) to its current shape, the wavefront 212a of the beam 212 can be changed from a first generally linear shape in the image plane generally transverse to the beam 212 to a second shape 508 in the image plane the actuators 506 can include piezomechanical transducers or other suitable types of actuators. In other embodiments, the elements 504a-e of the lens 502 can be manipulated using other methods.

Figure 5B:
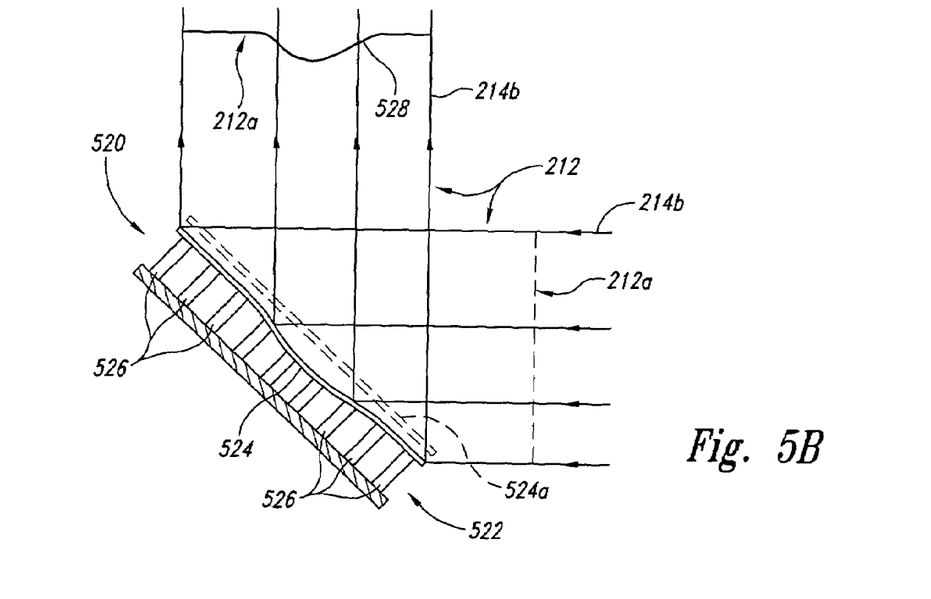
FIG. 5B is a partially schematic view of an adjustment structure that includes a reflective medium in accordance with another embodiment of the invention.

FIG. 5B is a side cross-sectional view of an adjustment structure 520 in accordance with another embodiment of the invention. The adjustment structure 520 includes a deformable reflective medium 522 that can be manipulated to shape the wavefront 212a of the beam 212. The reflective medium 522, for example, can include a continuous deformable reflective surface 524 coupled to one or more actuators 526. Alternatively, the reflective medium 522 can include an array of reflective elements coupled to one or more of the actuators 526. Reflective (or optionally non-reflective) material can be positioned in the interstices between adjacent reflective elements in such an array. In either embodiment, the actuators 526 can tilt, bend, or otherwise move discrete portions of the reflective surface 524 (or corresponding reflective element) from a first state (e.g., an undeflected shape 524a shown in broken lines) to a second state (e.g., a selected angle relative to the incident radiation arriving along the workpiece radiation path segment 214b from the reticle). Accordingly, the reflective medium 522 can alter the path (and thereby the shape of the wavefront 212a) of the incoming radiation to form a desired shape 528 of the wavefront 212a of the beam 212 in the image plane.

Figure 5C:
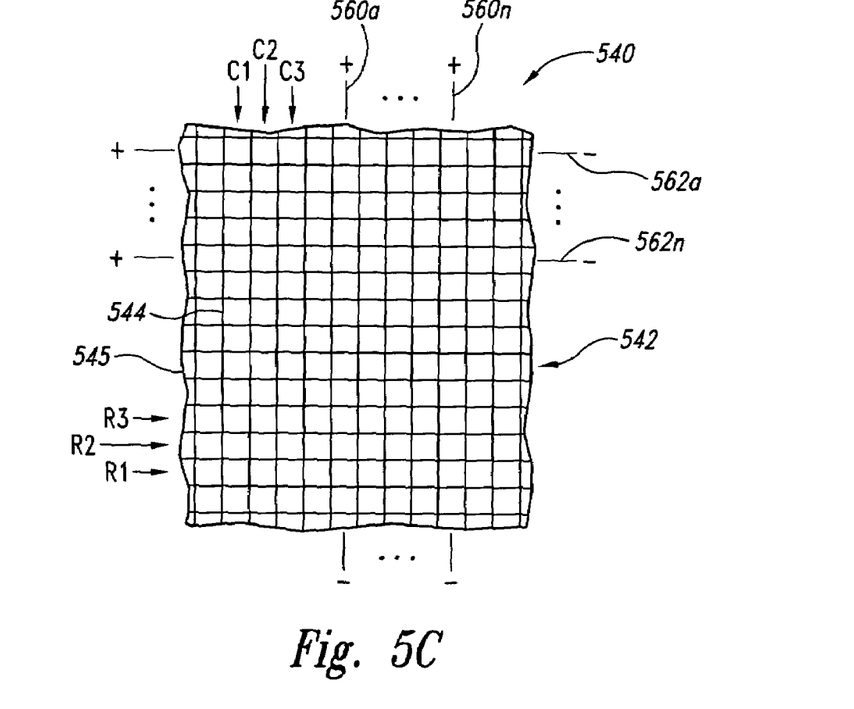
FIG. 5C is a partially schematic view of an adjustment structure that includes a selectively refractive and transmissive medium in accordance with yet another embodiment of the invention.

FIG. 5C is a partially schematic view of the face of yet another embodiment of an adjustment structure 540 viewed in a direction generally parallel to the radiation path 214 (FIG. 2). The adjustment structure 540 is a selectively refractive and transmissive medium 542 that includes a plurality of individually controllable elements 544 (e.g., opto-electrical elements) arranged in a generally co-planar array for selectively changing the optical properties (e.g., the refractive index and/or the extinction coefficient) of one or more portions of the beam 212 (FIG. 2). In other embodiments, the adjustment structure 540 may include an opto-electric coating. In the illustrated embodiment, each element 544 has a generally rectilinear shape (e.g., a square shape). In other embodiments, the elements 544 can have other shapes (e.g., a hexagonal shape or a circular shape). The elements 544 are arranged in an array 545 (e.g., a generally rectilinear array) including a plurality of rows (e.g., rows R1, R2, R3 . . . ) and columns (e.g., columns C1, C2, C3 . . . ). In other embodiments, the array 545 can be arranged in other patterns.

The elements 544 can be coupled to a source of electrical power (not shown) and can change from one refractive and transmissive state to another within a desired range. For example, each column can be independently coupled to a power source by column address lines 560 and each row can be coupled to a power source by row address lines 562. As such, a portion of the elements 544 can be charged to be in a first state to pass a portion of the beam 212 (FIG. 2) without altering the wavefront 212a of the beam 212, while another portion of the elements 544 can be charged to have a second different state to alter the shape of the wavefront 212a at the corresponding portion of the beam 212. In other embodiments, the states of the elements 544 can be changed in a variety of manners to produce any of a wide variety of wavefront shapes for the beam 212.

Figure 5D:
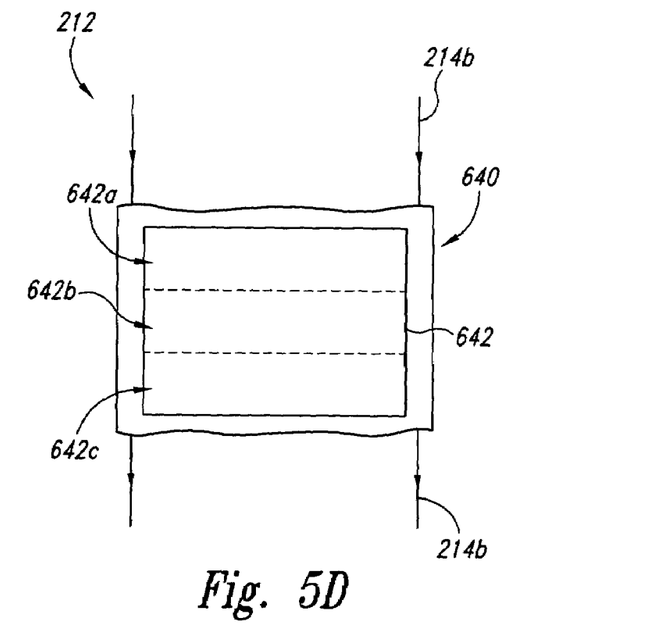
FIG. 5D is a partially schematic view of an adjustment structure that includes a stacked configuration in accordance with still yet another embodiment of the invention.

FIG. 5D is a partially schematic view of an adjustment structure 640 in accordance with still yet another embodiment of the invention. The adjustment structure 640 can include two or more independently controllable elements 642 (three are shown schematically in FIG. 6 as a first element 642a, a second element 642b, and a third element 642c). In this embodiment, the control elements 642a-c are vertically stacked relative to each other, as opposed to the side-by-side configuration of the control elements 242 in the adjustment structure 240 described above with respect to FIG. 2.

From the foregoing, it will be appreciated that specific embodiments of the invention have been described herein for purposes of illustration, but that various modifications may be made without deviating from the invention. For example, other adjustment structures may include any combination of the above-described arrangements of adjustment structures, or may include additional features not described above. Aspects of the invention described in the context of particular embodiments may be combined or eliminated in other embodiments. For example, alternative embodiments may include additional optical elements, or certain optical elements described above may be omitted. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited except as by the appended claims.

I claim:

1. A method for controlling characteristics of radiation in photolithographic processing of a microfeature workpiece, the method comprising:
    determining a profile of at least a portion of the workpiece;
    directing a radiation beam along a radiation path from a reticle to an adjustment structure, the radiation beam having a wavefront with a first configuration relative to an image plane generally transverse to the radiation path;
    based on the profile, changing at least one independently controllable and selectively transmissive element of the adjustment structure from a first state to a second state to change the wavefront of the radiation beam from the first configuration to a second configuration different than the first configuration, wherein the second configuration corresponds at least in part to the profile of the workpiece; and
    impinging the radiation beam on the workpiece while the wavefront is in the second configuration.

2. The method of claim 1 wherein the adjustment structure includes a lens having a first portion and a second portion, the lens being operatively coupled to an actuator, and wherein:
    directing a radiation beam along a radiation path from a reticle to an adjustment structure includes impinging a first portion of the radiation beam on the first portion of the lens and impinging a second portion of the radiation beam on the second portion of the lens; and
    changing at least one independently controllable element of the adjustment structure includes moving the first portion of the lens relative to and independently of the second portion of the lens.

3. The method of claim 1 wherein the adjustment structure includes a selectively refractive and transmissive medium having a first portion and a second portion, and wherein:
    directing a radiation beam along a radiation path from a reticle to an adjustment structure includes impinging a first portion of the radiation beam on the first portion of the medium and impinging a second portion of the radiation beam on the second portion of the medium; and
    changing at least one independently controllable element of the adjustment structure includes changing the refractive index and/or the extinction coefficient of the first portion of the medium relative to and independently of the refractive index and/or the extinction coefficient of the second portion of the medium.

4. The method of claim 1 wherein changing at least one independently controllable element of the adjustment structure from a first state to a second state includes applying an electrical signal to at least one element of the adjustment structure.

5. The method of claim 1, further comprising tilting the workpiece relative to the image plane before impinging the radiation beam on the workpiece.

6. The method of claim 1, further comprising passing the radiation beam through projection optics positioned between the adjustment structure and the workpiece.

7. The method of claim 1, further comprising passing the radiation beam through projection optics positioned between the reticle and the adjustment structure before directing the radiation beam to the adjustment structure.

8. The method of claim 1, further comprising directing the radiation beam from the radiation source along the radiation path and through illumination optics before directing the radiation beam from the reticle to the adjustment structure.

9. The method of claim 1, further comprising moving at least one of the reticle and the workpiece relative to the other while impinging the radiation beam on the workpiece.

10. The method of claim 1, further comprising scanning the reticle and the workpiece relative to each other by moving the reticle along a reticle path generally normal to the radiation path proximate to the reticle and moving the workpiece along a workpiece path in a direction opposite the reticle and generally normal to the radiation path.

11. The method of claim 1, further comprising stepping the workpiece and the reticle relative to each other by impinging the radiation beam on a first field of the workpiece while the workpiece is in a first fixed transverse alignment relative to the reticle, moving at least one of the reticle and the workpiece transversely relative to the other to align a second field with the reticle, and exposing the second field to the radiation while the workpiece is in a second fixed transverse alignment relative to the reticle.

12. A method for controlling characteristics of radiation in photolithographic processing of a microfeature workpiece, the method comprising:
    directing a radiation beam alone a radiation path from a radiation source to a reticle;
    directing the radiation beam alone the radiation path from the reticle to an adjustment structure, the radiation beam having a wavefront with a first shape in an image plane generally transverse to the radiation path;
    determining a profile of at least a portion of the workpiece;
    changing a state of at least one of a plurality of independently controllable and selectively transmissive elements of the adjustment structure from one state to another state to change the wavefront of the radiation beam from the first shape to a second shape different than the first shape, the second shape corresponding at least in part to a profile of the workpiece;
    directing the radiation beam away from the adjustment structure alone the radiation path; and
    impinging the radiation beam directed away from the adjustment structure on the workpiece.

13. The method of claim 12 wherein the adjustment structure includes a lens having a first portion and a second portion, the lens being operatively coupled to an actuator, and wherein:
directing the radiation beam along the radiation path from the reticle to an adjustment structure includes impinging a first portion of the radiation beam on the first portion of the lens and impinging a second portion of the radiation beam on the second portion of the lens; and
changing a state of at least one of a plurality of independently controllable elements of the adjustment structure includes moving the first portion of the lens relative to and independently of the second portion of the lens.

14. The method of claim 12 wherein the adjustment structure includes a selectively refractive and transmissive medium having a first portion and a second portion, and wherein:
directing the radiation beam along the radiation path from the reticle to an adjustment structure includes impinging a first portion of the radiation beam on the first portion of the medium and impinging a second portion of the radiation beam on the second portion of the medium; and
changing a state of at least one of a plurality of independently controllable elements of the adjustment structure includes changing the refractive index and/or the extinction coefficient of the first portion of the medium relative to and independently of the refractive index and/or the extinction coefficient of the second portion of the medium.

15. The method of claim 12 wherein changing a state of at least one of a plurality of independently controllable elements of the adjustment structure from one state to another state includes applying an electrical signal to at least one element of the adjustment structure.

16. The method of claim 12, further comprising tilting the workpiece relative to the image plane before impinging the radiation beam on the workpiece.

17. The method of claim 12, further comprising passing the radiation beam through projection optics positioned between the adjustment structure and the workpiece.

18. The method of claim 12, further comprising passing the radiation beam through projection optics positioned between the reticle and the adjustment structure before directing the radiation beam to the adjustment structure.

19. The method of claim 12, further comprising directing the radiation beam through illumination optics positioned between the radiation source and the reticle before directing the radiation beam to the reticle.

20. A method for controlling characteristics of radiation in photolithographic processing of a microfeature workpiece, the method comprising:
determining a profile of at least a portion of the workpiece;
directing a radiation beam along a radiation path from a reticle to an adjustment structure, the radiation beam having a wavefront with a first portion and a second portion, the first and second portions each having a first configuration relative to an image plane generally transverse to the radiation path;
based on the profile, changing at least one independently controllable element of the adjustment structure from a first state to a second state to (a) change the first portion of the radiation beam from the first configuration to a second configuration different than the first configuration, and (b) change the second portion of the radiation beam from the first configuration to a third configuration different than the first configuration and the second configuration, wherein the second configuration and the third configuration correspond at least in part to the profile of the workpiece;
directing the radiation beam away from the adjustment structure along the radiation path; and
impinging the first and second portions of the radiation beam directed away from the adjustment structure on the workpiece while the first portion is in the second configuration and the second portion is in the third configuration.

21. The method of claim 20 wherein the adjustment structure includes a lens having a first portion and a second portion, the lens being operatively coupled to an actuator, and wherein:
directing a radiation beam along a radiation path from a reticle to an adjustment structure includes impinging the first portion of the radiation beam on the first portion of the lens and impinging the second portion of the radiation beam on the second portion of the lens; and
changing at least one independently controllable element of the adjustment structure includes moving the first portion of the lens relative to and independently of the second portion of the lens.

22. The method of claim 20 wherein the adjustment structure includes a reflective medium having a first reflective surface coupled to a first actuator and a second reflective surface coupled to a second actuator, and wherein:
directing a radiation beam along a radiation path from a reticle to an adjustment structure includes impinging the first portion of the radiation beam on the first reflective surface and impinging the second portion of the radiation beam on the second reflective surface; and
changing at least one independently controllable element of the adjustment structure includes moving the first reflective surface relative to and independently of the second reflective surface.

23. The method of claim 20 wherein the adjustment structure includes a selectively refractive and transmissive medium having a first portion and a second portion, and wherein:
directing a radiation beam along a radiation path from a reticle to an adjustment structure includes impinging the first portion of the radiation beam on the first portion of the medium and impinging the second portion of the radiation beam on the second portion of the medium; and
changing at least one independently controllable element of the adjustment structure includes changing the refractive index and/or the extinction coefficient of the first portion of the medium relative to and independently of the refractive index and/or the extinction coefficient of the second portion of the medium.

24. A method for irradiating a radiation-sensitive material of a workpiece, the method comprising:
determining a profile of at least a portion of the workpiece;
directing a radiation beam along a radiation path from a reticle to an adjustment structure having a plurality of selectively transmissive elements, the radiation beam having a wavefront with a first configuration relative to an image plane generally transverse to the radiation path;
passing the radiation beam through at least a portion of the adjustment structure to change the configuration of the wavefront from the first configuration to a second configuration different than the first configuration, the second configuration corresponding at least in part to the determined profile of the workpiece; and directing the radiation beam from the adjustment structure to the workpiece.

25. The method of claim 24 wherein the adjustment structure includes a lens having a first portion and a second portion, the lens being operatively coupled to an actuator, and wherein:
  directing a radiation beam along a radiation path from a reticle to an adjustment structure includes impinging a first portion of the radiation beam on the first portion of the lens and impinging a second portion of the radiation beam on the second portion of the lens; and
  passing the radiation beam through at least a portion of the adjustment structure to change the configuration of the wavefront from the first configuration to a second configuration includes moving the first portion of the lens relative to and independently of the second portion of the lens.

26. The method of claim 24 wherein the adjustment structure includes a selectively refractive and transmissive medium having a first portion and a second portion, and wherein:
  directing a radiation beam along a radiation path from a reticle to an adjustment structure includes impinging a first portion of the radiation beam on the first portion of the medium and impinging a second portion of the radiation beam on the second portion of the medium; and
  passing the radiation beam through at least a portion of the adjustment structure to change the configuration of the wavefront from the first configuration to a second configuration includes changing the refractive index and/or the extinction coefficient of the first portion of the medium relative to and independently of the refractive index and/or the extinction coefficient of the second portion of the medium.

27. The method of claim 24 wherein the adjustment structure includes a plurality of independently controllable elements changeable from a first state to a second state thereby changing the wavefront of the beam from the first configuration to the second configuration, and wherein changing the elements of the adjustment structure from a first state to a second state includes applying an electrical signal to one or more elements of the adjustment structure to independently change the elements from the first state to the second state.

28. The method of claim 24, further comprising tilting the workpiece relative to the image plane before directing the radiation beam from the adjustment structure to the workpiece.

29. An apparatus for controlling characteristics of radiation directed to a workpiece, the apparatus comprising:
  a workpiece support positioned to carry the workpiece;
  a radiation source positioned to direct a radiation beam along a radiation path toward the workpiece support, the radiation beam having a wavefront with a first configuration relative to an image plane generally transverse to the radiation path;
  a reticle positioned along the radiation path between the source of radiation and the workpiece support; and
  an adjustment structure positioned in the radiation path between the reticle and the workpiece support to receive the radiation beam with the wavefront having the first configuration, wherein the adjustment structure has one or more independently controllable and selectively transmissive elements configured to change from a first state to a second state thereby changing the wavefront of the radiation beam from the first configuration to a second configuration corresponding at least in part to a profile of the workpiece; and
  a controller operatively coupled to the adjustment structure and configured to control the one or more independently controllable elements of the adjustment structure to change from the first state to the second state to change the wavefront of the radiation beam from the first configuration to the second configuration.

30. The apparatus of claim 29 wherein the adjustment structure includes a lens operatively coupled to an actuator, the lens including a first portion and a second portion, the first portion being positioned to move relative to and independently of the second portion to change the wavefront of the radiation beam from the first configuration to the second configuration.

31. The apparatus of claim 29 wherein the adjustment structure includes a selectively refractive and transmissive medium having a first portion and a second portion, the first portion being positioned to move relative to and independently of the second portion to change the wavefront of the radiation beam from the first configuration to the second configuration.

32. The apparatus of claim 29 further comprising a controller operatively coupled to the adjustment structure, wherein the controller is electrically coupled to each of the independently controllable elements of the adjustment structure and is configured to apply a variable voltage to each element to independently change the elements from the first state to the second state.

33. The apparatus of claim 29, further comprising projection optics positioned along the radiation path between the adjustment structure and the workpiece support.

34. The apparatus of claim 29, further comprising projection optics positioned along the radiation path between the reticle and the adjustment structure.

35. The apparatus of claim 29 wherein at least one of the reticle and the workpiece support is movable relative to the other.

36. The apparatus of claim 29 wherein:
  the reticle is coupled to a reticle actuator to move along a reticle path generally normal to the radiation path proximate to the reticle; and
  the workpiece support is coupled to a workpiece support actuator to move along a workpiece support path in a direction opposite the reticle and generally normal to the radiation path proximate to the workpiece support.

37. The apparatus of claim 29 wherein at least one of the workpiece support and the reticle is operatively coupled to the controller to sequentially align portions of the workpiece with the radiation beam when the workpiece is carried by the workpiece support.

38. An apparatus for controlling characteristics of radiation directed to a workpiece, the apparatus comprising:
  a workpiece support positioned to carry the workpiece;
  a radiation source positioned to direct a radiation beam along a radiation path toward the workpiece support, the radiation beam having a wavefront with a first configuration relative to an image plane generally transverse to the radiation path;
  a reticle positioned along the radiation path between the source of radiation and the workpiece support, the reticle being configured to pattern the radiation beam passing toward the workpiece support;
  an adjustment structure positioned in the radiation path between the reticle and the workpiece support, the adjustment structure having a first transmissive portion and a second transmissive portion, wherein the first portion is configured to change from a first state to a second state relative to the second portion to change the configuration of the wavefront of the radiation beam from the first configuration to a second configuration corresponding at least in part to a profile of the workpiece; and a controller operatively coupled to the adjustment structure and configured to change the first portion from the first state to the second state.

39. The apparatus of claim 38 wherein the adjustment structure includes a lens operatively coupled to an actuator, the lens including a first portion and a second portion, the first portion being positioned to move relative to and independently of the second portion to change the wavefront of the radiation beam from the first configuration to the second configuration.

40. The apparatus of claim 38 wherein the adjustment structure includes a selectively refractive and transmissive medium having a first portion and a second portion, the first portion being positioned to move relative to and independently of the second portion to change the wavefront of the radiation beam from the first configuration to the second configuration.

41. The apparatus of claim 38, further comprising projection optics positioned along the radiation path between the adjustment structure and the workpiece support.

42. The apparatus of claim 38, further comprising projection optics positioned along the radiation path between the reticle and the adjustment structure.

43. The apparatus of claim 38 wherein at least one of the reticle and the workpiece support is movable relative to the other.

44. The apparatus of claim 38 wherein:
the reticle is coupled to a reticle actuator to move along a reticle path generally normal to the radiation path proximate to the reticle; and
the workpiece support is coupled to a workpiece support actuator to move along a workpiece support path in a direction opposite the reticle and generally normal to the radiation path proximate to the workpiece support.

45. The apparatus of claim 38 wherein at least one of the workpiece support and the reticle is operatively coupled to the controller to sequentially align portions of the workpiece with the radiation beam when the workpiece is carried by the workpiece support.

46. An apparatus for controlling characteristics of radiation directed to a workpiece, the apparatus comprising:
workpiece support means positioned to carry the workpiece;
radiation source means positioned to direct a radiation beam along a radiation path toward the workpiece support, the radiation beam having a wavefront with a first shape in an image plane generally transverse to the radiation path;
a reticle positioned along the radiation path between the source of radiation and the workpiece support, the reticle being configured to pattern the radiation beam passing toward the workpiece support;
adjustment means positioned in the radiation path between the reticle and the workpiece support means and configured to receive the radiation beam with the wavefront having the first shape and transmit the radiation beam with a wavefront having a second shape in the image plane corresponding at least in part to a profile of the workpiece, the adjustment means including a plurality of independently controllable and selectively transmissive elements changeable from one state to another state to change the wavefront of the radiation beam from the first shape to the second shape; and
control means operatively coupled to the adjustment means to direct the elements of the adjustment means to change from the one state to another state to change the shape of the wavefront of the radiation beam from the first shape to the second shape.

47. A method for controlling characteristics of radiation in photolithographic processing of a microfeature workpiece, the method comprising:
directing a radiation beam along a radiation path from a reticle to an adjustment structure, the radiation beam having a wavefront with a first configuration relative to an image plane generally transverse to the radiation path, the adjustment structure including a reflective medium having a first reflective surface coupled to a first actuator and a second reflective surface coupled to a second actuator;
changing at least one independently controllable element of the adjustment structure from a first state to a second state to change the wavefront of the radiation beam from the first configuration to a second configuration different than the first configuration; and
impinging the radiation beam on the workpiece while the wavefront is in the second configuration,
wherein directing the radiation beam along the radiation path from the reticle to the adjustment structure includes impinging a first portion of the radiation beam on the first reflective surface and impinging a second portion of the radiation beam on the second reflective surface; and
wherein changing at least one independently controllable element of the adjustment structure includes moving the first reflective surface relative to and independently of the second reflective surface.

48. A method for controlling characteristics of radiation in photolithographic processing of a microfeature workpiece, the method comprising:
directing a radiation beam along a radiation path from a radiation source to a reticle;
directing the radiation beam along the radiation path from the reticle to an adjustment structure, the radiation beam having a wavefront with a first shape in an image plane generally transverse to the radiation path, the adjustment structure including a reflective medium having a first reflective surface coupled to a first actuator and a second reflective surface coupled to a second actuator;
changing a state of at least one of a plurality of independently controllable elements of the adjustment structure from one state to another state to change the wavefront of the radiation beam from the first shape to a second shape different than the first shape, the second shape corresponding at least in part to a profile of the workpiece;
directing the radiation beam away from the adjustment structure along the radiation path; and
impinging the radiation beam directed away from the adjustment structure on the workpiece,
wherein directing the radiation beam along the radiation path from the reticle to the adjustment structure includes impinging a first portion of the radiation beam on the first reflective surface and impinging a second portion of the radiation beam on the second reflective surface; and
wherein changing the state of at least one of a plurality of independently controllable elements of the adjustment structure includes moving the first reflective surface relative to and independently of the second reflective surface.

49. A method for irradiating a radiation-sensitive material of a workpiece, the method comprising:
determining a profile of at least a portion of the workpiece;

directing a radiation beam along a radiation path from a reticle to an adjustment structure, the radiation beam having a wavefront with a first configuration relative to an image plane generally transverse to the radiation path, wherein the adjustment structure includes a reflective medium having a first reflective surface coupled to a first actuator and a second reflective surface coupled to a second actuator;

passing the radiation beam through at least a portion of the adjustment structure to change the configuration of the wavefront from the first configuration to a second configuration different than the first configuration, the second configuration corresponding at least in part to the determined profile of the workpiece; and directing the radiation beam from the adjustment structure to the workpiece, wherein directing the radiation beam along the radiation path from the reticle to the adjustment structure includes impinging a first portion of the radiation beam on the first reflective surface and impinging a second portion of the radiation beam on the second reflective surface, and wherein passing the radiation beam through at least a portion of the adjustment structure to change the configuration of the wavefront from the first configuration to a second configuration includes moving the first reflective surface relative to and independently of the second reflective surface.

50. An apparatus for controlling characteristics of radiation directed to a workpiece, the apparatus comprising:

a workpiece support positioned to carry the workpiece;

a radiation source positioned to direct a radiation beam along a radiation path toward the workpiece support, the radiation beam having a wavefront with a first configuration relative to an image plane generally transverse to the radiation path;

a reticle positioned along the radiation path between the source of radiation and the workpiece support; and an adjustment structure positioned in the radiation path between the reticle and the workpiece support to receive the radiation beam with the wavefront having the first configuration, wherein the adjustment structure has one or more independently controllable elements configured to change from a first state to a second state thereby changing the wavefront of the radiation beam from the first configuration to a second configuration, wherein the adjustment structure includes a reflective medium having a first reflective surface and a second reflective surface, the first reflective surface being positioned to move relative to and independently of the second reflective surface to change the wavefront of the radiation beam from the first configuration to the second configuration.

51. The apparatus of claim 50 wherein the first reflective surface forms a continuous surface with the second reflective surface.

52. An apparatus for controlling characteristics of radiation directed to a workpiece, the apparatus comprising:

a workpiece support positioned to carry the workpiece;

a radiation source positioned to direct a radiation beam along a radiation path toward the workpiece support, the radiation beam having a wavefront with a first configuration relative to an image plane generally transverse to the radiation path;

a reticle positioned along the radiation path between the source of radiation and the workpiece support, the reticle being configured to pattern the radiation beam passing toward the workpiece support;

an adjustment structure positioned in the radiation path between the reticle and the workpiece support, the adjustment structure having a first portion and a second portion, wherein the first portion is configured to change from a first state to a second state relative to the second portion to change the configuration of the wavefront of the radiation beam from the first configuration to a second configuration corresponding at least in part to a profile of the workpiece; and a controller operatively coupled to the adjustment structure and configured to change the first portion from the first state to the second state, wherein the adjustment structure includes a reflective medium having a first reflective surface and a second reflective surface, the first reflective surface being positioned to move relative to and independently of the second reflective surface to change the wavefront of the radiation beam from the first configuration to the second configuration.

53. The apparatus of claim 52 wherein the first reflective surface forms a continuous surface with the second reflective surface.

* * * * *

UNITED STATES PATENT AND TRADEMARK OFFICE
CERTIFICATE OF CORRECTION

PATENT NO. : 7,446,855 B2  Page 1 of 1
APPLICATION NO. : 11/189383
DATED : November 4, 2008
INVENTOR(S) : Byers It is certified that error appears in the above-identified patent and that said Letters Patent is hereby corrected as shown below:

In column 10, line 50, in Claim 12, delete "alone" and insert -- along --, therefor.

In column 10, line 52, in Claim 12, delete "alone" and insert -- along --, therefor.

In column 10, line 65, in Claim 12, delete "alone" and insert -- along --, therefor.

Signed and Sealed this

Third Day of March, 2009

JOHN DOLL
*Acting Director of the United States Patent and Trademark Office*